United States Patent [19]

Arai

[11] Patent Number: 5,716,863
[45] Date of Patent: Feb. 10, 1998

[54] METHOD OF MANUFACTURING SEMICONDUCTOR DEVICE HAVING ELEMENTS DIFFERENT IN GATE OXIDE THICKNESS AND RESISTIVE ELEMENTS

[75] Inventor: Norihisa Arai, Omiya, Japan

[73] Assignee: Kabushiki Kaisha Toshiba, Kawasaki, Japan

[21] Appl. No.: 655,471

[22] Filed: May 30, 1996

[30] Foreign Application Priority Data

Jun. 1, 1995 [JP] Japan ................... 7-135225

[51] Int. Cl.$^6$ .................. H01L 21/8247; H01L 21/265
[52] U.S. Cl. ............... 437/41; 437/43; 437/60; 437/918
[58] Field of Search ................. 437/43, 52, 60, 437/918, 41

[56] References Cited

U.S. PATENT DOCUMENTS

| | | |
|---|---|---|
| 4,408,385 | 10/1983 | Mohan Rao et al. |
| 5,134,088 | 7/1992 | Zetterlund ............... 437/60 |
| 5,196,233 | 3/1993 | Chan et al. ............... 437/186 |
| 5,356,826 | 10/1994 | Natsume ............... 437/60 |
| 5,489,547 | 2/1996 | Erdeljac et al. ............... 437/60 |
| 5,585,302 | 12/1996 | Li ............... 437/60 |

FOREIGN PATENT DOCUMENTS 6-224192  8/1994  Japan.

Primary Examiner—John Niebling
Assistant Examiner—Richard A. Booth
Attorney, Agent, or Firm—Banner & Witcoff, Ltd.

[57] ABSTRACT

A plurality of device isolation insulating layers are formed on the surface of a semiconductor substrate. A gate insulating layer is formed on the substrate surface between each device isolation insulating layer. After that, a first polysilicon layer is deposited over the entire surface of the substrate. The first polysilicon layer is patterned so that it is left on a region where a first transistor is to be formed and a resistive element is defined on one of the device isolation insulating layers. A silicon oxide layer is formed on a portion of the first polysilicon layer that is left to define the resistive element. This silicon oxide layer prevents impurities from penetrating into the polysilicon defining the resistive element and acts as an etching stopper for the polysilicon when a second polysilicon layer and a layer of refractory metal is removed.

20 Claims, 5 Drawing Sheets

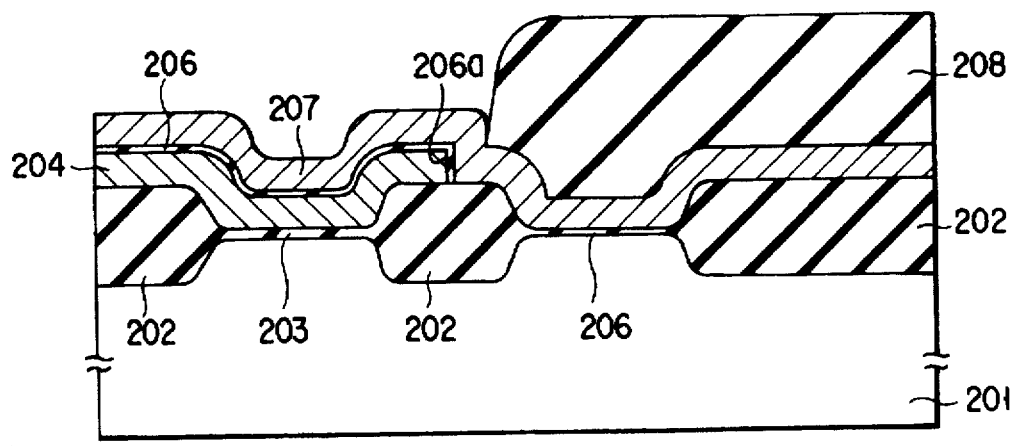
F I G. 5B
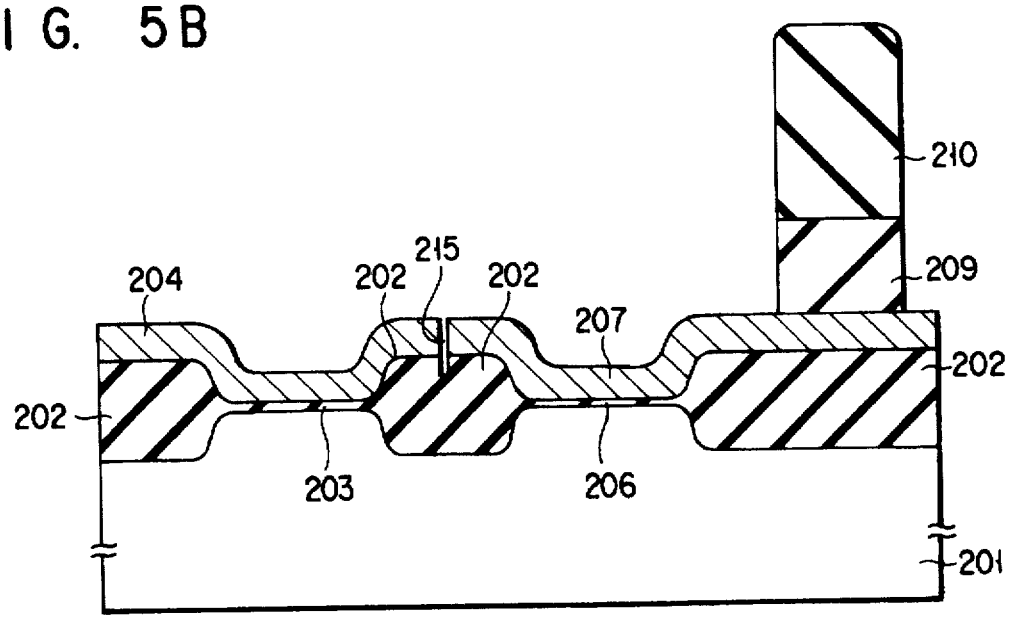
F I G. 6A
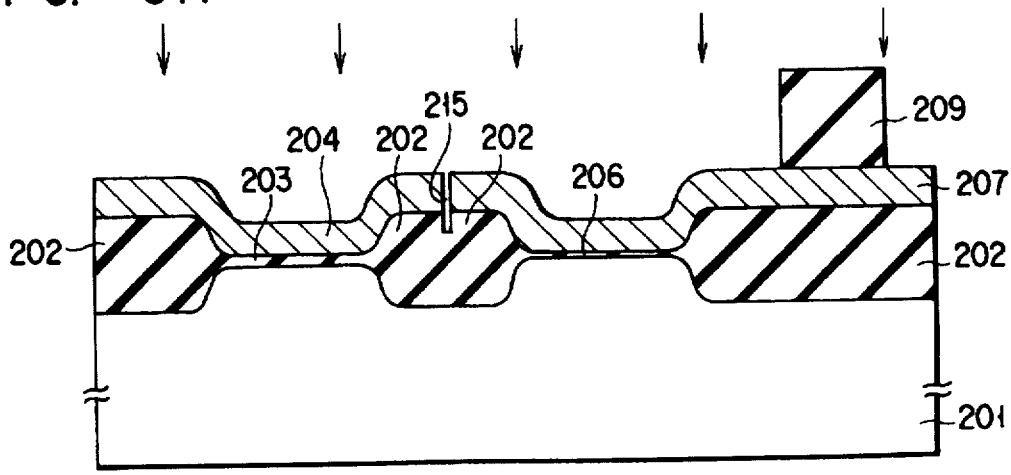
F I G. 6B

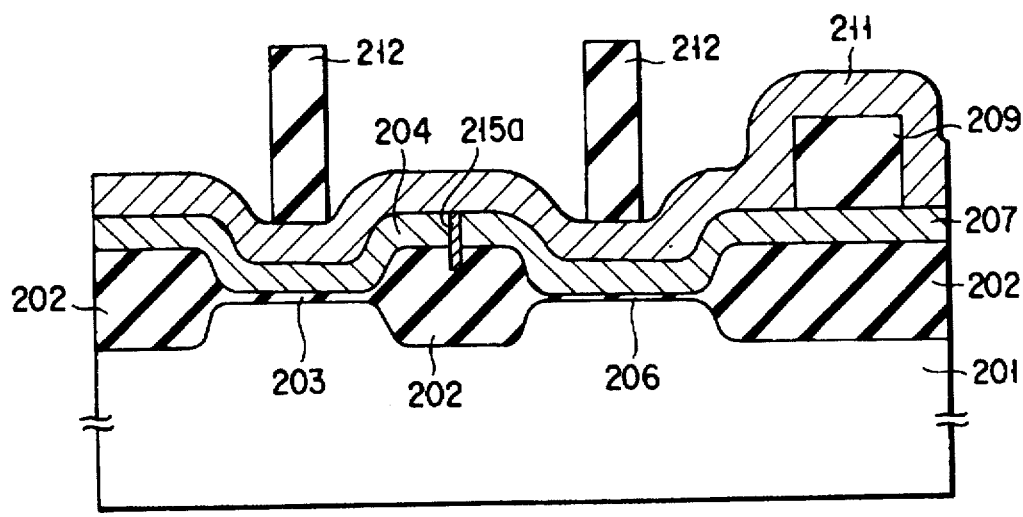
F I G. 7A
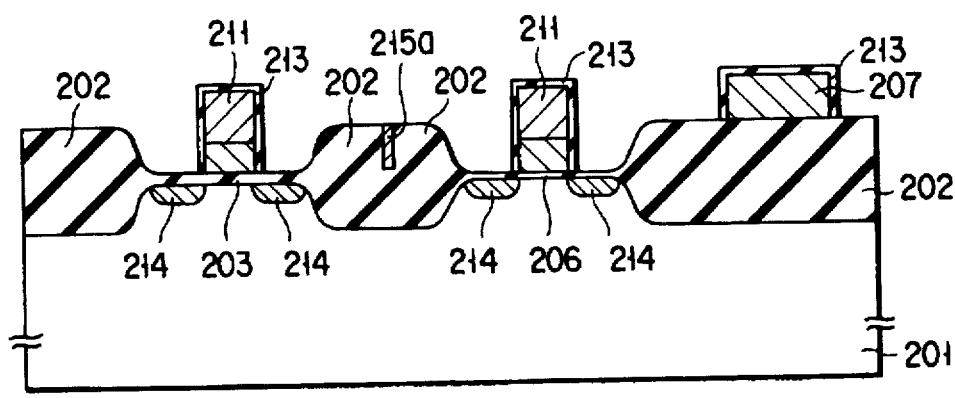
F I G. 7B
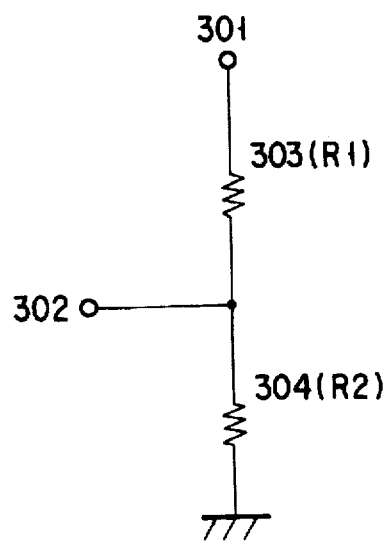
F I G. 8

METHOD OF MANUFACTURING SEMICONDUCTOR DEVICE HAVING ELEMENTS DIFFERENT IN GATE OXIDE THICKNESS AND RESISTIVE ELEMENTS

BACKGROUND OF THE INVENTION

1. Field of the Invention

The invention relates to a method of manufacturing a semiconductor device in which, as in the peripheral circuit of a nonvolatile memory, elements that are operated from multiple power supplies and have gate oxide layers that are different in thickness depending on the applied supply voltages and resistive elements are formed on the same semiconductor substrate.

2. Description of the Related Art

In recent years, high-speed, high-density semiconductor devices are in increasing demand. In order to manufacture such semiconductor devices, a large number of complex manufacturing steps are required, which will inevitably reduce the manufacturing yield of the devices. Moreover, the manufacturing cost has risen and difficulties are involved in obtaining high reliability.

To meet high-speed, high-density requirements for semiconductor devices, the fine structuring of semiconductor elements or transistors according to scaling rules is effective. According to the known scaling rules, however, it is generally considered that electric fields applied to semiconductor elements should be held constant. Thus, the fine structuring of semiconductor elements involves lowering the supply voltage thereto. A system which incorporates semiconductor devices is not allowed to use an original power supply and usually uses a 5-V supply. For this reason, when the device dimensions are scaled down with the supply voltage held constant, the electric fields inside the device becomes higher and higher. In order to obtain the reliability, therefore, it is required to make the thickness of gate oxide layers large to some extent to thereby lower the electric field across the gate oxide layers. That is, the gate oxide thickness is not scaled, which degrades the device performance.

Conventionally semiconductor devices have been developed which discretely incorporates elements that are operated from a high supply voltage and elements that are operated from a low supply voltage. That is, the elements operated from the high supply voltage (hereinafter referred to as HV elements) are formed so that their gate oxide is relatively thick and the elements operated from a low supply voltage (referred to as LV elements) are formed so that their gate oxide is relatively thin.

The two types of gate oxide layers can be formed by first oxidizing a silicon substrate to some extent to form a layer of silicon dioxide ($SiO_2$) on the substrate surface and then subjecting the substrate to thermal oxidation after the removal of the silicon dioxide layer on substrate regions where the LV elements are to be formed. With this process, however, since the gate oxide layer is directly coated with a resist pattern containing contaminants such as heavy metals, it becomes easy to suffer breakdown, forming one of serious causes of faults. For this reason, it is usual to include a poly buffer process to block the contamination due to the resist pattern by polysilicon.

With a semiconductor device incorporating elements operated from different supply voltages, it is required to generate a plurality of supply voltages (hereinafter referred to as internal supply voltages) used inside the device from an externally applied supply voltage (hereinafter referred to as an external supply voltage). FIG. 8 shows an example of a circuit that generates an internal supply voltage from an external supply voltage. This circuit is generally a resistive potential divider. In FIG. 8, the external supply voltage Vout to an external supply voltage terminal 301 and the internal supply voltage Vin output from an internal supply voltage terminal 302 are related by $$Vin = R2/(R2+R1) \times Vout \qquad (1)$$

where R1 and R2 are values of resistive elements 303 and 304, respectively.

In this case, the resistive elements are each required to have a high resistance value of the order of megohms to gigaohms. This satisfies voltage stability and low power dissipation requirements. The resistive elements should preferably be made of polysilicon that contains no impurity (non-doped polysilicon) or lightly-doped polysilicon for the reason to be stated below. Materials available as resistive elements include gate electrode layers and diffused layers within a silicon substrate in addition to lightly doped polysilicon. However, these materials are ones used to construct MOS transistors. Tuning these materials to have high resistivity will reduce the capability of driving MOS transistors, which runs counter to high-speed requirements.

In order to make the gate electrode layers or the diffused layers highly resistive as desired which should preferably be of low resistivity from the point of view of the characteristics of MOS transistors, a very large area is needed, resulting in a significant increase in stray capacitance. An increase in the stray capacitance results in an increase in the response time, preventing MOS devices operating at high speed. Accordingly, it is preferable that the resistive elements be made of lightly doped polysilicon.

FIGS. 5A through 7B illustrate a method of forming high-resistivity elements using lightly doped polysilicon, which is disclosed in Japanese Unexamined Patent Publication No. 6-224192. Hereinafter, this method will be described.

As shown in FIG. 5A, a device isolation insulating layer 202 is formed on areas of the surface of a semiconductor substrate 201 and then a silicon oxide layer 203 serving as the gate oxide of HV elements is formed on other areas of the substrate surface than the areas where the device isolation insulating layer 202 is formed. After that, a polysilicon layer 204 is formed over the entire surface of the substrate and a resist pattern 205 is formed on areas of the polysilicon layer that are located above the substrate regions where the HV elements are to be formed.

After that, the polysilicon layer 204 and the silicon oxide layer 203 on other areas of the substrate surface than areas where the HV elements are to be formed are etched away using the resist pattern 205 as a mask. Next, as shown in FIG. 5B, a silicon oxide layer 206, serving as the gate oxide of LV elements, is formed and then a polysilicon layer 207 is formed over the entire surface. After that, a resist pattern 208 is formed on areas of the polysilicon layer 207 other than the areas that are located above the substrate regions where HV elements are to be formed.

Next, using the resist pattern 208 as a mask, portions of the polysilicon layer 207 and the silicon oxide layer 206 that are located above the substrate regions where the HV elements are to be formed are etched away by means of, for example, RIE (reactive ion etching). Next, a silicon dioxide layer 209 is deposited onto the entire surface (this is not necessarily required) of the polysilicon layer 207 or the polysilicon layer 204 and then a resist pattern 210 is formed on areas of the silicon dioxide layer 209 where resistive elements are to be formed. Using this resist pattern as a mask, the silicon dioxide layer 209 is selectively etched. FIG. 6A shows this stage of manufacture. Next, as shown in FIG. 6B, areas of the polysilicon layers other than areas where the resistive elements are to be formed are selectively doped with impurities.

Next, as shown in FIG. 7A, a layer 211 of tungsten silicide (WSi) is formed and then a resist layer 212 corresponding to a gate electrode pattern is formed. Next, using this resist layer as a mask, the polysilicon layers 204 and 207 and the tungsten silicide layer 211 are etched to form gate electrodes and remove the tungsten silicide layer 211 and the silicon silicide layer 209 in the resistive element forming areas. After that, as shown in FIG. 7B, a post-oxide layer 213 is formed on the gate electrodes and diffused layers are formed within the semiconductor substrate 201. The resistivity of the gate electrodes are made low because of conversion of tungsten silicide to polycide.

With the device thus formed, only the gate electrodes constructing MOS transistors are rendered low in resistivity owing to conversion of the tungsten silicide layer to polycide. The conversion of the polysilicon defining resistive elements to polycide is prevented by the tungsten silicide layer being blocked by the silicon dioxide layer 209. Moreover, the resistive elements are associated with little stray capacitance and serve as desired high-resistivity elements. In addition, there is no step of directly coating the gate insulating layers 203 and 206 with a resist pattern containing contaminants such as heavy metals. Thus, the high quality of these gate insulating layers is maintained, increasing the reliability of the device.

However, the above-described method requires at least four additional manufacturing steps. The four steps are:

(1) a step of doping the polysilicon and depositing the silicon dioxide layer for blocking the conversion of the tungsten silicide layer to polycide;

(2) a step of forming the resist pattern 210 used in patterning the silicon dioxide layer 209;

(3) a step of patterning the silicon dioxide layer 209 using the resist pattern as a mask; and (4) a step of removing the resist pattern 210.

In addition, there arises the following problem with processes. In the step of patterning the silicon dioxide layer 209, the silicon dioxide layer 206a present at the boundary between the polysilicon layer 204 for forming the HV elements and the polysilicon layer 207 for forming the LV elements will also be etched simultaneously. Since the thickness of the silicon dioxide layer 206a in the vertical direction is smaller than that of the silicon oxide layer 209, the silicon dioxide layer 206a and the device isolation insulating layer 202 are etched simultaneously by RIE, thereby forming a slit 215. Since the area of the slit 215 thus formed is very small, the subsequently deposited tungsten silicide layer 210 is embedded in the slit as shown in FIG. 7A and forms a residue 215a that cannot be etched away.

The residue 215a produces stress based on the growth of grain in the subsequent heat treatment, which may cause a crack in the field insulating layer 202 and the underlying silicon substrate 201 and thus decrease the yield and reliability. A possible countermeasure against this may be to leave the silicon dioxide layer for forming the resistive elements at the boundary between the polysilicon layers 204 and 207. However, to leave a layer that is not necessary for operation at that boundary will increase the chip area.

With a device which, like nonvolatile memories, incorporates transistors of a multilayer gate type, it is possible to use floating gate electrodes as resistive elements. However, since the floating gate electrodes are naturally doped with impurities, it is difficult to obtain desired resistivity.

SUMMARY OF THE INVENTION

It is an object of the invention to provide a method of manufacturing a semiconductor device in which elements having gate oxide layers different in thickness and resistive elements are formed on the same substrate, which prevents the number of steps of forming the resistive elements from increasing, realizes desired high resistivity of polysilicon, and permits high-speed operation and high density of the semiconductor device, and lower the manufacturing cost.

According to an aspect of the invention there is provided a method of manufacturing a semiconductor device in which a first transistor having a first gate insulating layer, a second transistor having a second gate insulating layer different in thickness from the first gate insulating layer and a resistive element are formed on a semiconductor substrate, comprising the steps of: forming a plurality of device isolation insulating layers on the semiconductor substrate; forming the first gate insulating layer between the device isolation insulating layers; forming a polysilicon layer on the device isolation insulating layers and the first gate insulating layer; forming a resist pattern on each of a region where the first transistor is to be formed and a region where the resistive element is to be formed, the region where the resistive element is to be formed being located on one of the device isolation insulating layers; and patterning the resistive element (which is made of the polysilicon layer) and removing the polysilicon layer located over a region where the second transistor is to be formed by using the resist pattern as a mask.

According to the manufacturing method, the polysilicon layer is patterned so that it is left over the region where the first transistor is to be formed and the resistive element is defined on a device isolation insulating layer. Thus, a step of patterning the resistive element is omitted, preventing the number of manufacturing steps from increasing. Moreover, a high-resistivity resistive element can be obtained using polysilicon. Furthermore, the area of the pattern of the resistive element can be reduced, allowing high packing density of the semiconductor device.

In addition, according to the manufacturing method, no slit is formed in the device isolation insulating layer at the boundary between the first and second transistors. For this reason, a defect due to a material remaining in the slit can be avoided, increasing the manufacturing yield. Moreover, there is no need to set the boundary between the first and second transistors wide, permitting the pattern area to be decreased.

Moreover, according to the manufacturing method of the invention, when non-doped polysilicon is used, the number of steps for forming the resistive element can be decreased. Thus, the manufacturing cost can be reduced.

The resistive element thus formed becomes sufficiently small in its associated stray capacitance in comparison with a resistive element formed by diffusing impurities into the silicon substrate. Thus, the delay time due to the resistive element is improved, allowing high-speed operation.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 5A and 5B are sectional views of a semiconductor device in the order of steps of a conventional manufacturing method;

FIGS. 6A and 6B are sectional views of the semiconductor device in manufacturing steps subsequent to the step of FIG. 5B;

FIGS. 7A and 7B are sectional views of the semiconductor device in manufacturing steps subsequent to the step of FIG. 6B; and FIG. 8 shows an application of resistive elements.

DETAILED DESCRIPTION OF THE PREFERRED EMBODIMENTS

FIGS. 1A, 1B, 1C, 2A, 2B, 3A, 3B, 4A and 4B show a method of manufacturing a peripheral circuit of a flash EEPROM according to the present invention.

The peripheral circuit of the flash EEPROM includes elements operated with different supply voltages. That is, the peripheral circuit includes MOSFETs each having a thick gate insulating layer and operated with a high voltage (hereinafter referred to as HV MOSFETs) and MOSFETs each having a thin gate insulating layer and operated with a low voltage (hereinafter referred to as LV MOSFETs). The peripheral circuit further includes resistive elements adapted to divide an external supply voltage to produce a supply voltage necessary to drive the LV MOSFETs.

Figure 1A:
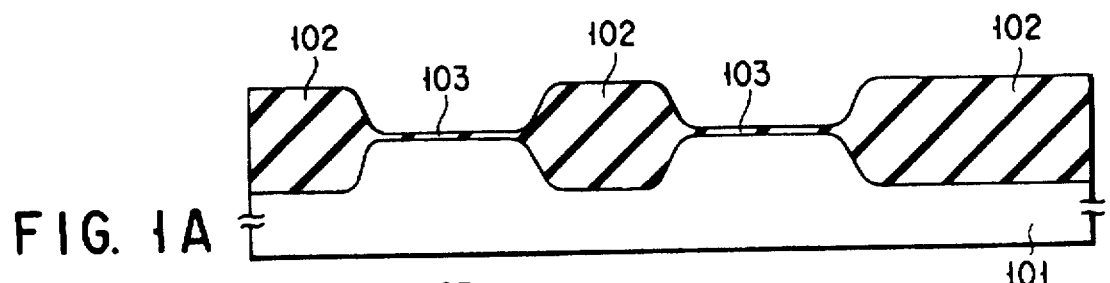
FIGS. 1A, 1B and 1C are sectional views of a semiconductor device in the order of steps of a manufacturing method according to the invention.

First, as shown in FIG. 1A, a plurality of device isolation layers 102 are formed on the major surface of a P-type silicon substrate 101 to a thickness of 700 nm by means of LOCOS (localized oxidation of silicon). A silicon oxide layer of about 15 nm in thickness (not shown) is formed on the surface of the silicon substrate between each device isolation layer 102. After that, to control threshold voltages of the elements, boron is ion-implanted through the oxide layer into the surface of the silicon substrate 101 at 45 KeV and at a dose of $3\times10^{12}$ cm$^{-2}$. Next, the silicon oxide layer is removed by a process using ammonium fluoride (NH$_4$F) and then the substrate undergoes dry oxidation at 900° C. Thereby, a layer 103 of silicon oxide of 30 nm in thickness is formed on the silicon substrate 101, which serves as the gate insulating layer of the HV MOSFETs.

Figure 1B:
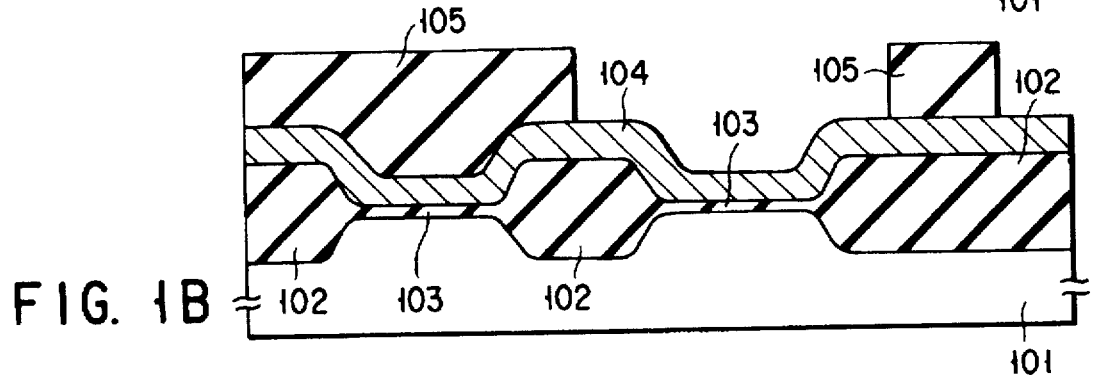

Subsequently, as shown in FIG. 1B, a polysilicon layer 104 of 100 nm in thickness is formed by means of LPCVD (low-pressure chemical vapor deposition), which serves as the gate electrodes of the HV MOSFETs and the resistive elements.

Figure 1C:
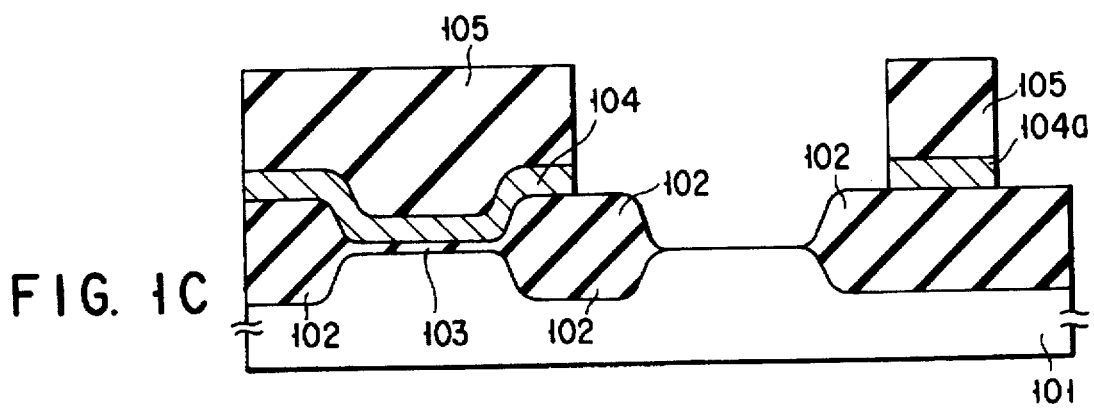

Next, using a conventional lithographic technique, a resist pattern 105 is formed on the HV MOSFET forming regions and the resistive element forming regions. After that, using the resist pattern 105 as a mask, the polysilicon layer 104 is etched to form a pattern of the resistive elements 104a as shown in FIG. 1C. At the same time, the polysilicon layer 104 and the silicon oxide layer 103 on the LV MOSFET forming regions are etched away with the polysilicon layer 104 on the HV MOSFET forming regions left.

Next, the resist pattern 105 is removed and then the silicon substrate 101 is subjected to dry oxidation at 800° C. to thereby form a silicon oxide layer 106 of 9 nm in thickness on the silicon substrate 101, which serves as the gate insulating layer of the LV MOSFETs. At this point, the pattern 104a of the polysilicon layer defining the resistive elements is also oxidized simultaneously, forming a silicon oxide layer 106a on the surface of that polysilicon layer. In this case, a silicon oxide layer 106c is also formed on the polysilicon layer 104.

Figure 2A:
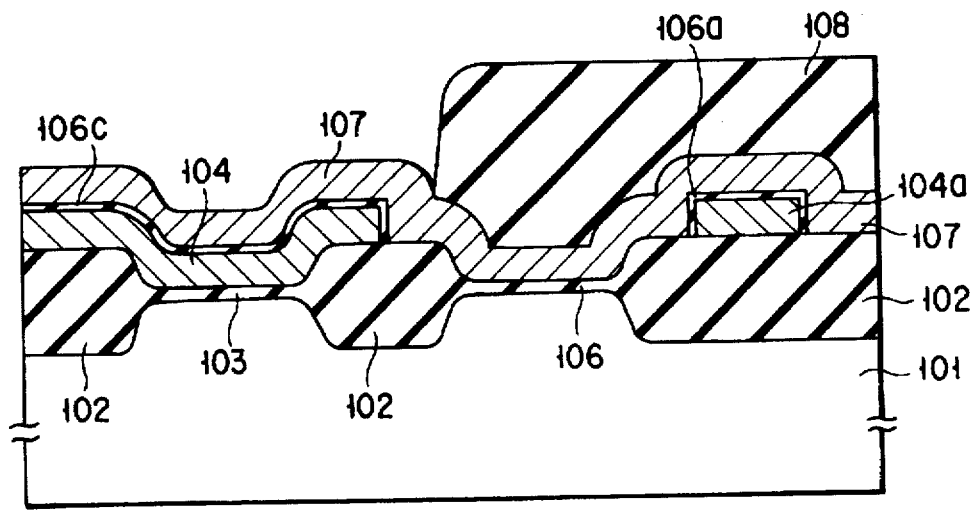
FIGS. 2A and 2B are sectional views of the semiconductor device in manufacturing steps subsequent to the step of FIG. 1C.

Next, as shown in FIG. 2A, a polysilicon layer 107 of 100 nm in thickness is formed over the entire surface by means of LPCVD, which serves as the gate electrodes of the LV MOSFETs. After that, a resist pattern 108 is formed on regions except the HV MOSFET forming regions. Subsequently, the polysilicon layer 107 and the oxide layer 107c on the HV MOSFET forming regions are etched away using the resist pattern 108 as a mask.

Figure 2B:
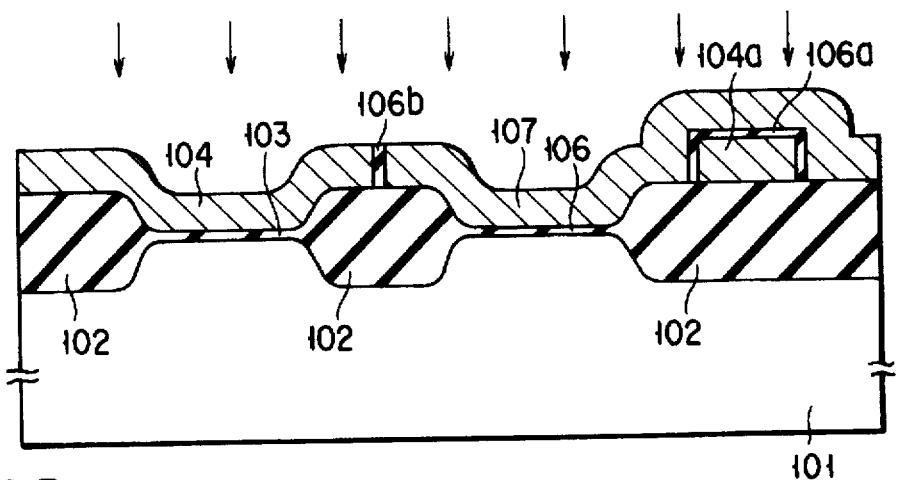

Next, as shown in FIG. 2B, the resist pattern 108 is removed and then phosphorus is ion implanted into the polysilicon layers 107 and 104 at 35 Kev and at a dose of $3\times10^{15}$ cm$^{-2}$. At this point, the pattern 104 of polysilicon, which defines the resistive elements, remains highly resistive because penetration of phosphorus thereinto is blocked by the silicon oxide layer 106a.

Figure 3A:
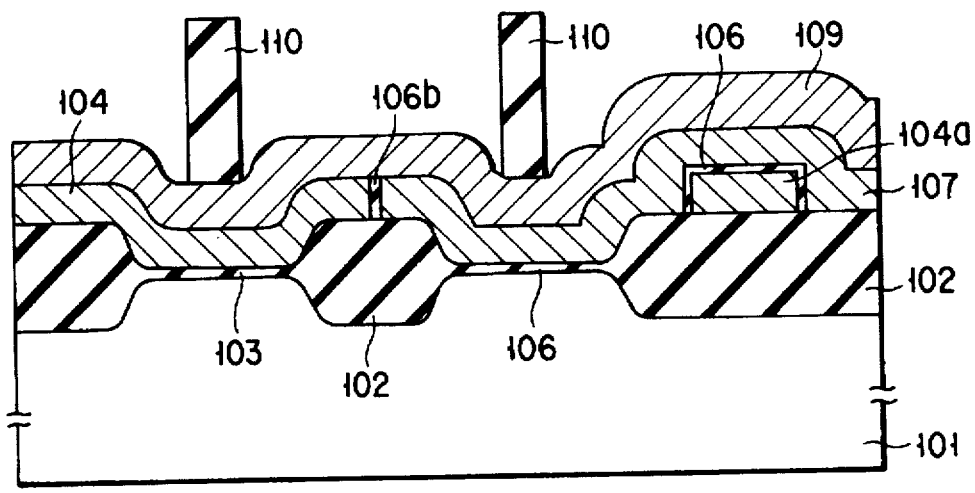
FIGS. 3A and 3B are sectional views of the semiconductor device in manufacturing steps subsequent to the step of FIG. 2B.

Next, as shown in FIG. 3A, a layer 109 of tungsten silicide, which is one of refractory metals, is deposited over the entire surface at a thickness of 300 nm by means of a conventional sputtering technique. After that, a resist pattern 110 for the gate electrode pattern of the LV and HV MOSFETs is formed on the tungsten silicide layer 109.

Figure 3B:
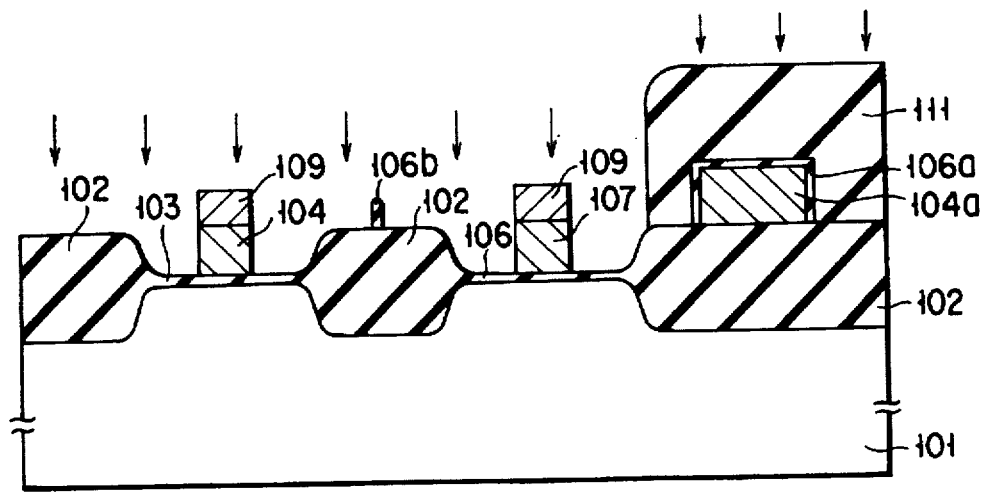

Next, as shown in FIG. 3B, by using the resist pattern 110 as a mask, the tungsten silicide layer 109 and the polysilicon layers 104 and 107 are etched to leave the gate electrode pattern of the HV MOSFETs and the gate electrode pattern of the LV MOSFETs. At this point, the silicon oxide layer 106a present on the resistive elements 104a acts as etching stopper, so that only the tungsten silicide layer 109 and the polysilicon layer 107 on the resistive elements are etched away. Also, the silicon oxide layer 106b existing between the polysilicon layers 104 and 107 is left on the device isolation insulating layer 102.

Next, as shown in FIG. 3B, after the resist pattern 110 has been removed, a resist pattern 111 is formed to cover at least the resistive element forming regions. By using the resist pattern 111 and the tungsten silicide layer 109 as a mask, arsenic is ion-implanted into the silicon substrate 101 at 50 KeV and at a dose of $6\times10^{15}$ cm$^{-2}$ to form the source and drain regions of the MOSFETs.

Figure 4A:
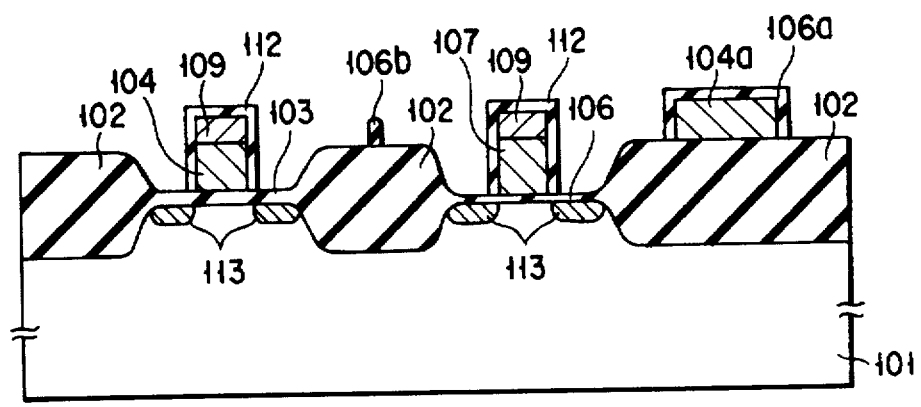
FIGS. 4A and 4B are sectional views of the semiconductor device in manufacturing steps subsequent to the step of FIG. 3B.

Next, as shown in FIG. 4A, the resist pattern 111 is peeled off. After that, a post oxide layer 112 of 35 nm in thickness is formed on the surface of the gate electrodes by subjecting the substrate 101 to dry oxidation at 950° C. At the same time, the arsenic ions implanted into the silicon substrate 101 is made active to form the source and drain diffusion layers 113. Further, at this point, the tungsten silicide layer 109 and the polysilicon layer 104 which serve as the gate electrode pattern of the HV MOSFETs are converted to polycide. The tungsten silicide layer 109 and the polysilicon layer 107 which serve as the gate electrode pattern of the LV MOSFETs are also converted to polycide. Thus, the sheet resistance of these gate electrode patterns becomes as low as 4 ohms per square.

Figure 4B:
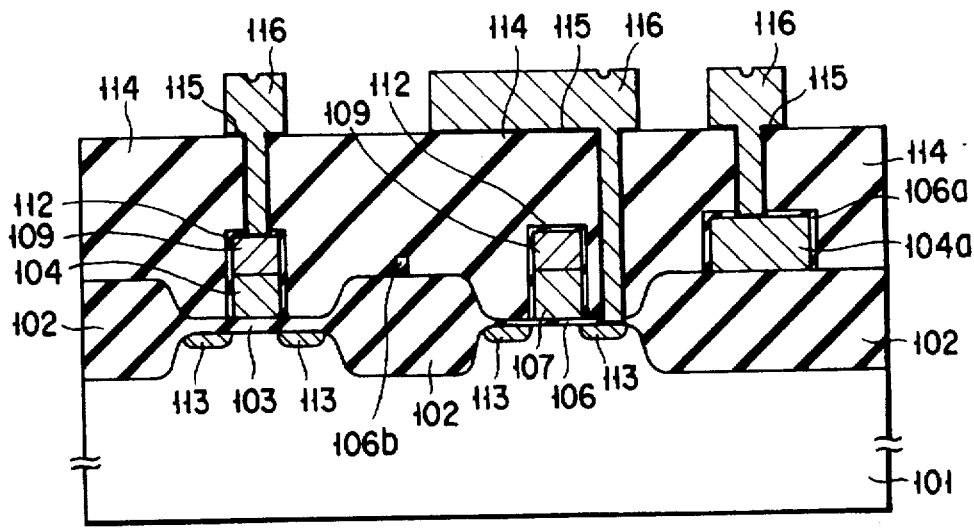
Figure 5A:
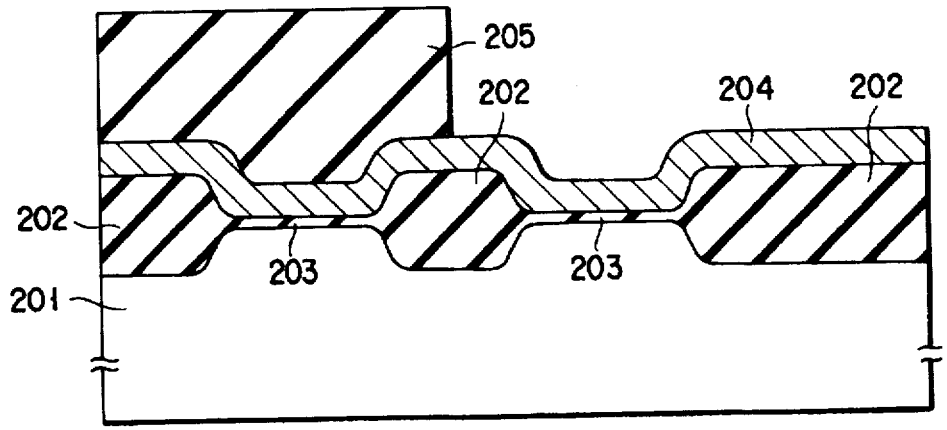

Next, as shown in FIG. 4B, a BPSG (boro-phospho silicate glass) layer 114 of 1.8 micrometers in thickness is formed as a passivation layer by means of CVD. Next, a plurality of contact holes are formed in the BPSG layer 114 and then a compound layer 115 of titan (Ti) and titanium nitride (TiN) and an aluminum silicide (AlSi) layer 116 are formed by sputtering. After that, these layers are patterned to form aluminum metal lines.

In the peripheral circuit of the flash EEPROM thus formed, the resistive elements 104a are formed by the same layer as the floating gate electrodes of the EEPROM.

The flash EEPROM (not shown) is subsequently manufactured through conventional processes.

The resistive voltage divider of FIG. 8 puts importance on the balance of resistance values and can take any resistance values if they are sufficiently large. Thus, the resistors should preferably be made of non-doped polysilicon. With a circuit arrangement that requires a prescribed resistance value, however, the resistance value can be controlled by the following method.

A first method is to ion-implant impurities, such as phosphorus, into the entire surface of the polysilicon layer 104 as needed after it has been formed as shown in FIG. 1B. In this case, a desired resistance value can be obtained by lightly doping the polysilicon layer with impurities instead of using the non-doped polysilicon layer as resistive elements.

A second method is to introduce impurities into the polysilicon layer 104a as well when impurities are introduced into the polysilicon layers 104 and 107 which constitute the gate electrodes of the MOSFETs as shown in FIG. 2B. This is not restrictive. If polysilicon which has been doped with impurities in advance is used for the polysilicon layers 104 and 107, then the step of introducing impurities into the polysilicon layers 104 and 107 can be omitted. In this case, the resistive elements is made of the doped polysilicon. By setting the thickness of the polysilicon layer 104 small, say, to about 50 nm, a high resistance value of the order of 0.5 ohms per square can be obtained.

A third method is to dope the polysilicon layer 104a with impurities in the step of introducing phosphorus into the polysilicon layers 104 and 107 constituting the gate electrodes of the MOSFETs as shown in FIG. 2B. For this doping, a conventional process using $POCl_3$ can be used. In this case, the silicon oxide layer 106b left between the HV MOSFET forming region and the LV MOSFET forming region can be removed by an $NH_4F$-based process after the $POCl_3$ process.

According to the third method, even when the silicon oxide layer 106b is left as an unwanted protrusion at the boundary between the HV MOSFET forming region and the LV MOSFET forming region as shown in FIG. 3B, the protrusion can be removed ultimately. This will prevent the manufacturing yield from dropping due to the unwanted protrusion.

Although, in the step shown in FIG. 3A, the layer 109 of tungsten silicate is used, this is not restrictive. Another refractory metal, such as molybdenum silicate (MoSi), titan (Ti), or the like, can be used.

Further, instead of using the layer 109 of tungsten silicate in the step of FIG. 3A, a third polysilicon layer may be deposited onto the polysilicon layer 107. In this case, the third polysilicon layer may be doped with impurities after it has been deposited or polysilicon that has been doped with impurities in advance may be deposited as the third polysilicon layer.

When the third polysilicon layer is deposited onto the polysilicon layer, the volume of the gate electrodes increases, permitting the gate electrode lines of low resistivity to be formed. Since the polysilicon has better thermal stability than refractory metals, heat treatment can be carried out at a high temperature of about 1100° C. for a long time after the third polysilicon layer has been deposited. When the present invention is particularly applied to the manufacture of a nonvolatile memory device, a post-oxide layer made at high temperature improves data holding characteristics, which greatly increases the reliability of the device.

When the polysilicon layer is used in place of a refractory metal in the step of FIG. 3A, optimization conditions for performing an RIE process on the polysilicon layer can be used in etching the deposited polysilicon layer. Thus, the setting of etching conditions becomes easy in comparison with etching of stacked layers of refractory metal and polysilicon, permitting the manufacturing cost to be reduced.

Furthermore, the step of introducing impurities into the polysilicon layers 104 and 107 constituting the gate electrodes of the MOSFETs in FIG. 2B may be omitted and a third polysilicon layer may be used in place of the layer 109 of tungsten silicide. In this case, impurities are introduced simultaneously into the third polysilicon layer and the polysilicon layers 104 and 107 underlying the third polysilicon layer by using a process using $POCl_3$ or ion implantation. According to this method, the polysilicon layers can be doped with impurities at one time.

In general, when impurities are directly introduced into the polysilicon layers 104 and 107, a natural oxide layer is liable to grow on the surface of the polysilicon layers. It is therefore inevitable that the natural oxide layer remains at the interface with the third polysilicon layer that is deposited subsequently. The natural oxide layer is normally destroyed by the step of doping the third polysilicon layer with impurities. However, when the natural oxide layer is thick, it will not be destroyed. The natural oxide layer left locally serves as an etching stopper in etching the stacked layers of polysilicon using the resist pattern 110 as shown in FIG. 3A, making it difficult to etch the polysilicon layers. Therefore, when the third polysilicon layer is used in place of a layer of refractory metal, it is preferable that impurities be simultaneously introduced into the third polysilicon layer and the underlying polysilicon layers 104 and 107 by using $POCl_3$ or ion implantation.

A layer of refractory metal may further be deposited on the third polysilicon layer to make gate electrodes of the first to third polysilicon layers and that refractory metal layer. Such a structure can avoid the local stress on the refractory metal at the time of post oxidation, preventing the refractory metal from peeling off due to abnormal oxidation.

As shown in FIG. 3B, it is required to cover the resistive element 104a with the resist layer 111 at the time of introducing impurities into the source and drain regions of N-channel MOSFETs. This resist layer is also used to cover P-channel MOSFETs (not shown) located on the same substrate. That is, the resist forming step is not carried out for the purpose of covering only the resistive elements. Therefore, the number of steps does not increase. When the resistance value required of the resistive elements is much lower than the order of megohms per square, it is not required to cover the resistive element 104a with the resist layer 111.

In the present embodiment of the present invention, a silicon thermal oxide layer is used for the gate insulating layer 103 of the HV MOSFET and the gate insulating layer 106 of the LV MOSFET. Instead, an silicon dioxide layer, an silicon nitride layer, or a compound layer of silicon dioxide and silicon nitride may be used. The silicon dioxide layer and the silicon nitride layer can be deposited by LPCVD.

In this case, the layer 106a surrounding the resistive element 104a is formed of the same material as the gate insulating layer of the LV MOSFETs. However, the functions of the layer 106a to block penetration of impurities and to act as an etching stopper at the time of peeling the layers 107 and 109 overlying the resistive element 104a are maintained even when those layers are used.

In addition, when an PLCVD deposited layer is used, the control of channel impurities becomes easy because the thermal step can be performed at low temperature. Thus, this method is effective in manufacturing devices required to incorporate finer MOSFETS.

Moreover, instead of using the silicon thermal oxide layer for the gate insulating layer 103 of the HV MOSFET and the gate insulating layer 106 of the LV MOSFET, use may be made of a layer resulting from subjecting a silicon thermal oxide layer or a LPCVD deposited silicon dioxide layer to thermal nitridation. In this case, the closeness of the insulating layer is improved, which further improves the functions of the layer 106a surrounding the resistive element.

In the present embodiment, the resistive element 104a is formed of polysilicon that is used to form the gate electrode of the HV MOSFET. This is not restrictive. The resistive element may be formed of polysilicon that is used to form the gate electrode of the LV MOSFET. In this case, the steps of forming the gate insulating layer and the gate electrode of the LV MOSFET are performed prior to the steps of forming the gate insulating layer and the gate electrode of the HV MOSFET.

The present embodiment was described in terms of an application of the invention to the peripheral circuit of a flash EEPROM. This is not restrictive. The invention can be applied to other devices in which MOSFETs each having a thick gate insulating layer, MOSFETs each having a thin gate insulating layer and resistive elements are formed on the same substrate. For example, when the invention is applied to a static RAM, the resistive elements shown in FIG. 8 can be used as load resistors. With SRAMs required to operate at high speed, their peripheral circuit often uses transistors each having a thick gate insulating layer and transistors each having a thin gate insulating layer. Thus, the present invention can be applied effectively to the SRAMs.

What is claimed is:

1. A method of manufacturing a semiconductor device in which a first transistor having a first gate insulating layer, a second transistor having a second gate insulating layer different in thickness from said first gate insulating layer and a resistive element are formed on a semiconductor substrate, comprising the steps of:

forming a plurality of device isolation insulating layers on said semiconductor substrate;

forming said first gate insulating layer between said device isolation insulating layers;

forming a polysilicon layer on said device isolation insulating layers and said first gate insulating layer;

forming a resist pattern on each of a region where said first transistor is to be formed and a region where said resistive element is to be formed, said region where said resistive element is to be formed being located on one of said device isolation insulating layers; and patterning said resistive element which is made of said polysilicon layer and completely removing said polysilicon layer located overlying a region where said second transistor is to be formed by using said resist pattern as a mask.

2. A method according to claim 1, wherein said first gate insulating layer is one of a layer obtained by subjecting a silicon oxide layer to thermal nitridation, a layer of silicon dioxide, a layer of silicon nitride, and a compound layer of silicon dioxide and silicon nitride.

3. A method according to claim 1, wherein said polysilicon layer is made of polysilicon that has been doped with impurities.

4. A method according to claim 1, further comprising introducing impurities into said polysilicon layer between the step of forming said polysilicon layer and the step of forming said resist pattern.

5. A method of manufacturing a semiconductor device in which a first transistor having a first gate insulating layer, a second transistor having a second gate insulating layer different in thickness from said first gate insulating layer and a resistive element are formed on a semiconductor substrate, comprising the steps of:

forming a plurality of device isolation insulating layers on said semiconductor substrate;

forming said first gate insulating layer between said device isolation insulating layers;

forming a first polysilicon layer on said device isolation insulating layers and said first gate insulating layer;

forming a first resist pattern on each of a region where said first transistor is to be formed and a region where said resistive element is to be formed, said region where said resistive element is to be formed being located on one of said device isolation insulating layers;

removing said first polysilicon layer and said first gate insulating layer located over a region where said second transistor is to be formed and patterning said first polysilicon layer to define said resistive element using said first resist pattern as a mask;

after said first resist pattern has been removed, forming said second gate insulating layer on said region where said second transistor is to be formed, forming an insulating layer on said first polysilicon layer left on said regions where said resistive element and said first transistor are to be formed, and then forming a second polysilicon layer over the entire surface of said semiconductor substrate;

forming a second resist pattern on said second polysilicon layer except said region where said first transistor is to be formed;

removing portions of said second polysilicon layer and said insulating layer overlying said first polysilicon layer that are located over said region where said first transistor is to be formed using said second resist pattern as a mask;

removing said second resist pattern and then forming a layer of refractory metal over the entire surface of said semiconductor substrate;

forming a plurality of third resist patterns on said layer of refractory metal, said third resist patterns being located over regions where gate electrodes of said first and second transistors are to be formed; and etching away said layer of refractory metal and said second and first polysilicon layers using said third resist pattern as a mask and removing said layer of refractory metal and said second polysilicon layer present on said region where said resistive element is to be formed.

6. A method according to claim 5, further comprising introducing impurities into said first and second polysilicon layers between the step of removing said second resist pattern and the step of forming said layer of refractory metal.

7. A method according to claim 6, wherein said step of introducing impurities is a process using $POCl_3$.

8. A method according to claim 7, further comprising removing a silicon oxide layer formed on one of said device isolation insulating layers located at a boundary between said first and second polysilicon layers by using ammonium fluoride after said process using $POCl_3$.

9. A method according to claim 5, further comprising introducing impurities into said first polysilicon layer between the step of forming said first polysilicon layer and the step of forming said first resist pattern.

10. A method according to claim 5, wherein each of said first and second gate insulating layers and said insulating layers is a layer obtained by subjecting silicon thermal oxide to thermal nitridation.

11. A method according to claim 5, wherein each of said first and second gate insulating layers and said insulating layers is a layer obtained by subjecting silicon thermal oxide formed by LPCVD to thermal nitridation.

12. A method of manufacturing a semiconductor device in which a first transistor having a first gate insulating layer, a second transistor having a second gate insulating layer different in thickness from said first gate insulating layer and a resistive element are formed on a semiconductor substrate, comprising the steps of:

forming a plurality of device isolation insulating layers on said semiconductor substrate;

forming said first gate insulating layer between said device isolation insulating layers;

forming a first polysilicon layer on said device isolation insulating layers and said first gate insulating layer;

forming a first resist pattern on each of a region where said first transistor is to be formed and a region where said resistive element is to be formed, said region where said resistive element is to be formed being located on one of said device isolation insulating layers;

removing said first polysilicon layer located over a region where said second transistor is to be formed and patterning said first polysilicon layer to define said resistive element using said first resist pattern as a mask;

after said first resist pattern has been removed, forming said second gate insulating layer on said region where said second transistor is to be formed, forming an insulating layer on said first polysilicon layer left on said regions where said resistive element and said first transistor are to be formed, and then forming a second polysilicon layer serving as the gate electrode of said second transistor over the entire surface of said semiconductor substrate;

forming a second resist pattern on said second polysilicon layer except said region where said first transistor is to be formed;

removing portions of said second polysilicon layer and said insulating layer overlying said first polysilicon layer that are located over said region where said first transistor is to be formed using said second resist pattern as a mask;

removing said second resist pattern and then forming a third layer of polysilicon over the entire surface of said semiconductor substrate;

forming third resist patterns on regions where gate electrodes of said first and second transistors are to be formed, etching away said third polysilicon layer, said second polysilicon layer and said first polysilicon layer using said third resist pattern as a mask and removing said third polysilicon layer and said second polysilicon layer on said region where said resistive element is to be formed.

13. A method according to claim 12, further comprising introducing impurities into said third polysilicon layer, said first polysilicon layer left on said region where said first transistor is to be formed and said second polysilicon layer left on said region where said second transistor is to be formed between the step of forming said third polysilicon layer and the step of forming said third resist pattern.

14. A method according to claim 12, further comprising introducing impurities into said first polysilicon layer between the step of forming said first polysilicon layer and the step of forming said first resist pattern.

15. A method according to claim 13, further comprising introducing impurities into said third polysilicon layer, said first polysilicon layer left on said region where said first transistor is to be formed and said second polysilicon layer left on said region where said second transistor is to be formed between the step of forming said third polysilicon layer and the step of forming said third resist pattern.

16. A method according to claim 15, wherein said first polysilicon layer is formed of polysilicon that has been doped with impurities.

17. A method according to claim 12, further comprising introducing impurities into said first polysilicon layer between the step of forming said first polysilicon layer and the step of forming said first resist pattern.

18. A method according to claim 15, wherein said second polysilicon layer is formed of polysilicon that has been doped with impurities.

19. A method according to claim 12, wherein each of said first and second gate insulating layers and said insulating layer is one of a layer obtained by subjecting silicon oxide to thermal nitridation, a layer of silicon dioxide, a layer of silicon nitride, and a compound layer of silicon dioxide and silicon nitride.

20. A method according to claim 12, wherein each of said first and second gate insulating layers and said insulating layer is a layer obtained by subjecting silicon thermal oxide formed by LPCVD to thermal nitridation.

* * * * *